United States Patent
Fujiuchi et al.

(10) Patent No.: US 9,524,996 B2
(45) Date of Patent: Dec. 20, 2016

(54) IMAGE SENSOR INCLUDING A CASING TO SEAL THE OPTICAL SYSTEM

(71) Applicant: MITSUBISHI ELECTRIC CORPORATION, Chiyoda-ku (JP)

(72) Inventors: Akiko Fujiuchi, Chiyoda-ku (JP); Ichihiro Abe, Chiyoda-ku (JP); Koichiro Okamura, Chiyoda-ku (JP); Seiichi Matsumura, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/777,645

(22) PCT Filed: Mar. 3, 2014

(86) PCT No.: PCT/JP2014/055331
§ 371 (c)(1),
(2) Date: Sep. 16, 2015

(87) PCT Pub. No.: WO2014/148236
PCT Pub. Date: Sep. 25, 2014

(65) Prior Publication Data
US 2016/0133661 A1    May 12, 2016

(30) Foreign Application Priority Data

Mar. 19, 2013   (JP) .................................. 2013-056761
Mar. 19, 2013   (JP) .................................. 2013-056764

(51) Int. Cl.
*H01L 27/146* (2006.01)
*H04N 1/028* (2006.01)
(Continued)

(52) U.S. Cl.
CPC ... *H01L 27/14618* (2013.01); *H01L 27/14625* (2013.01); *H04N 1/028* (2013.01); *H04N 1/0318* (2013.01); *H04N 1/19* (2013.01)

(58) Field of Classification Search
CPC ..................... H01L 27/14625; H01L 27/14618; H01L 27/14623; H01L 27/14649; H01L 31/0232; H01L 31/1055; H01L 27/14643; H01L 31/14; H04N 1/0318
See application file for complete search history.

(56) References Cited

U.S. PATENT DOCUMENTS 4,634,884 A * 1/1987 Hayashimoto ....... H04N 5/2259
                                                          250/208.1
5,317,146 A    5/1994 Isobe
(Continued)

FOREIGN PATENT DOCUMENTS

DE    692 24 273 T2    7/1998
JP    2-77963 U        6/1990
(Continued)

OTHER PUBLICATIONS

Combined Taiwanese Office Action and Search Report issued Dec. 28, 2015 in Patent Application No. 103109360 (with English language translation).
(Continued)

*Primary Examiner* — Mohsen Ahmadi
(74) *Attorney, Agent, or Firm* — Oblon, McClelland, Maier & Neustadt, L.L.P.

(57) ABSTRACT

An image sensor includes: a lens configured to focus light after passing through or reflected by an object to be read and passing through a first transparent plate; a sensor arranged along the X direction and configured to receive the light focused by the lens; a first casing fixing the first transparent plate and containing or retaining the lens and the sensor; and a bracket arranged at the X direction end portion of the first casing and configured to seal the lens contained or retained by the first casing.

12 Claims, 15 Drawing Sheets

(51) Int. Cl.
*H04N 1/19* (2006.01)
*H04N 1/031* (2006.01)

(56) References Cited

U.S. PATENT DOCUMENTS

| | | | | |
|---|---|---|---|---|
| 2013/0141637 | A1* | 6/2013 | Kaga | E06B 7/22 348/373 |
| 2015/0136951 | A1* | 5/2015 | Ohama | H04N 1/02815 250/208.1 |
| 2015/0381848 | A1* | 12/2015 | Matsui | H04N 1/02835 358/482 |

FOREIGN PATENT DOCUMENTS

| | | |
|---|---|---|
| JP | 4-368862 A | 12/1992 |
| JP | 2006-237997 A | 9/2006 |
| JP | 2008-140632 A | 6/2008 |
| JP | 2010-28216 A | 2/2010 |
| JP | 2010-283436 A | 12/2010 |
| JP | 2011-138734 A | 7/2011 |

OTHER PUBLICATIONS

International Search Report issued Apr. 15, 2014 in PCT/JP2014/055331 filed Mar. 3, 2014.

Office Action issued on Oct. 31, 2015 in German Patent Application No. 11 2014 001 556.3 with English translation.

Japanese Office Action issued in Application No. 2015-506679 on Jul. 12, 2016 (w/English translation).

* cited by examiner

IMAGE SENSOR INCLUDING A CASING TO SEAL THE OPTICAL SYSTEM

TECHNICAL FIELD

The present disclosure relates to an image sensor used in devices such as multi-function printers and banknote scanners.

BACKGROUND ART

An image sensor irradiates an object to be read using irradiation light emitted by a light source incorporated in a casing, and light reflected by the object to be read is focused through a focusing optical system, such as a lens, onto a photoelectric conversion element, and image data is obtained (for example, see Patent Literature 1).

The image sensor described in Patent Literature 1 is equipped with a first casing that retains a lens and a sensor board, and a second casing that retains a light source board and glass.

CITATION LIST

Patent Literature

Patent Literature 1: Unexamined Japanese Patent Application Kokai Publication No. 2006-237977.
Patent Literature 2: Unexamined Japanese Patent Application Kokai Publication No. 2008-140632.

SUMMARY OF INVENTION

Technical Problem

According to the image sensor described in Patent Literature 1, the focusing optical system is sealed by the second casing, but is not sealed by the first casing as a single casing. Thus the focusing optical system can become contaminated.

The present disclosure is developed to solve the aforementioned problem, and the present disclosure provides an image sensor that is capable of suppressing contamination of the focusing optical system.

Solution to Problem

The image sensor of the present disclosure comprises a focusing optical system, a light receiver, a first casing, and a bracket. The focusing optical system is configured to focus light after passing through or reflected by an irradiated object and passing through a first cover-plate portion. The light receiver is arranged along a main scanning direction and configured to receive the light focused by the focusing optical system. The board member is configured to support the light receiver. The first casing includes a first opening in a side of the irradiated object, a second opening in a side opposite to the side of the irradiated object, and a hole extending in the main scanning direction, the first casing being configured to contain or retain the focusing optical system and the light receiver. The bracket is configured to be fixed to a main scanning direction end portion of the first casing. The sealing plate is configured to be fixed to the bracket. The first cover-plate portion is configured to seal the first opening. The board member is configured to seal the second opening. The bracket and the sealing plate are configured to seal the hole. The focusing optical system contained or retained in the first casing is sealed.

Advantageous Effects of Invention

According to the present disclosure, the focusing optical system is sealed by the first casing, and thus an image sensor can be obtained that can suppress contamination of the focusing optical system.

DESCRIPTION OF EMBODIMENTS

Embodiment 1
Configuration and method of manufacturing the image sensor of Embodiment 1 of this disclosure are explained below. In the present specification, the expression "object to be read" refers to the irradiated object that is read as an image by the image sensor by receiving irradiation light irradiated by a light source. In the present specification, the expression "conveying of the object to be read", in addition to the case of conveying of the object to be read itself, also includes the case of movement of the image sensor itself in the sub-scanning direction relative to the object to be read.

Embodiment 1 is explained below using FIGS. 1 to 5. The X-Y-Z orthogonal coordinate system used in Embodiment 1 is defined in the following manner. The main scanning direction of the image sensor 100 is defined to be the X axis, and the sub-scanning direction is defined to be the Y axis. The Z axis is defined to be the direction orthogonal to the X axis and Y axis. The object to be read is disposed in the Z axis direction of the image sensor 100. The direction from the image sensor 100 to the object to be read is defined to be the positive direction of the Z axis. Hereinafter, the main scanning direction is referred to as the X direction, and the sub-scanning direction is referred to as the Y direction. The Z direction is the direction of focal depth. The object-to-be-read side of the image sensor 100 is referred to as the +Z side, and the opposite side is referred to as the −Z side. Similarly, the side in one direction along the main scanning direction is referred to as the +X side, and the side in the other direction is referred to as the −X side. Moreover, the side in one direction along the sub-scanning direction is referred to as the +Y side, and the side in the other direction is referred to as the −Y side. Furthermore, in Embodiment 1, the expression "scan width of the image sensor 100" refers to the linear length capable of being scanned by the image sensor 100. More specifically, the "scan width" is the linear length along the main scanning direction. In the figures, parts that are identical or equivalent to one another are indicated by the same reference sign.

Figure 1:
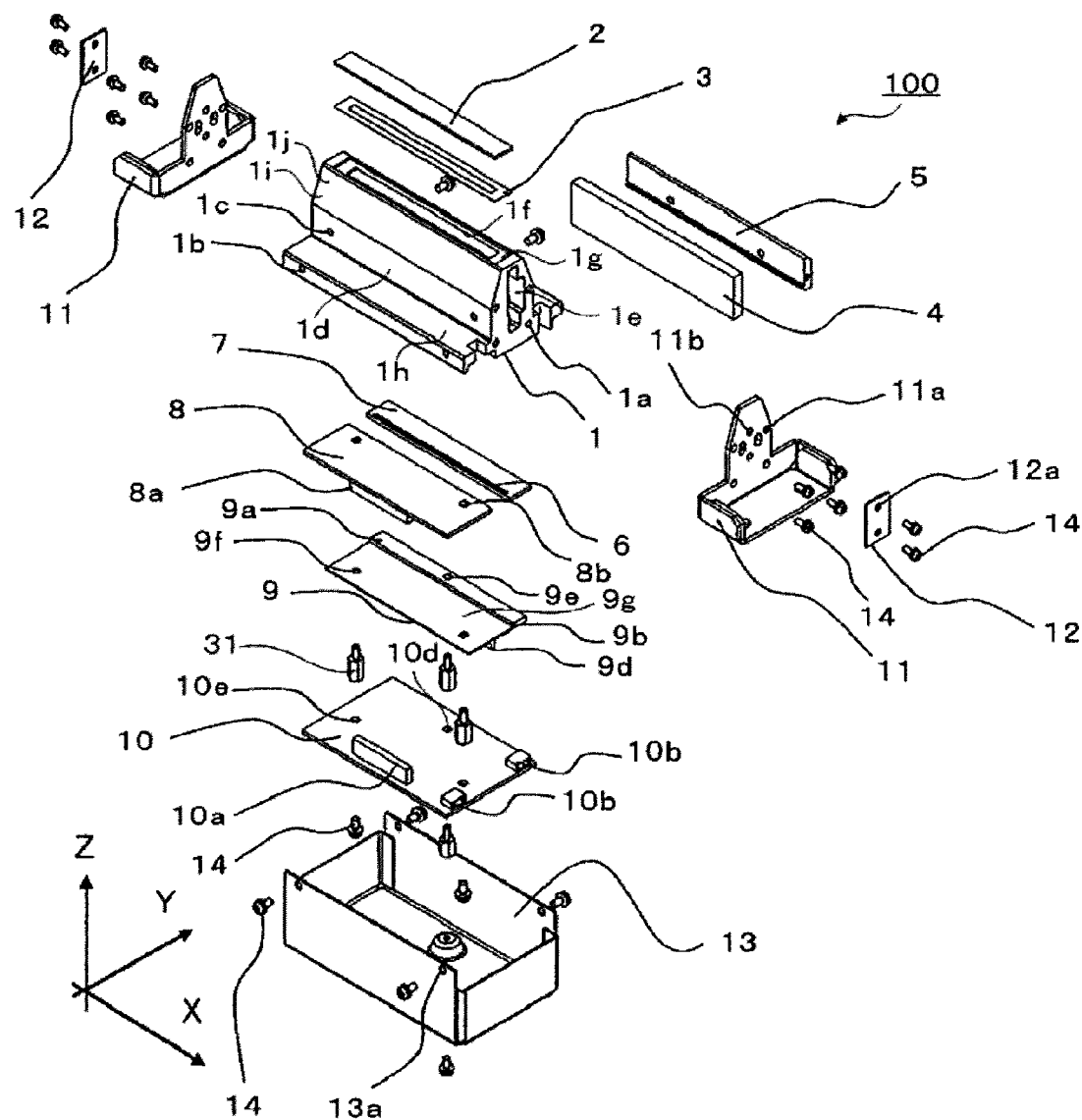
FIG. 1 is an exploded view of an image sensor according to Embodiment 1 of this disclosure.
Figure 2:
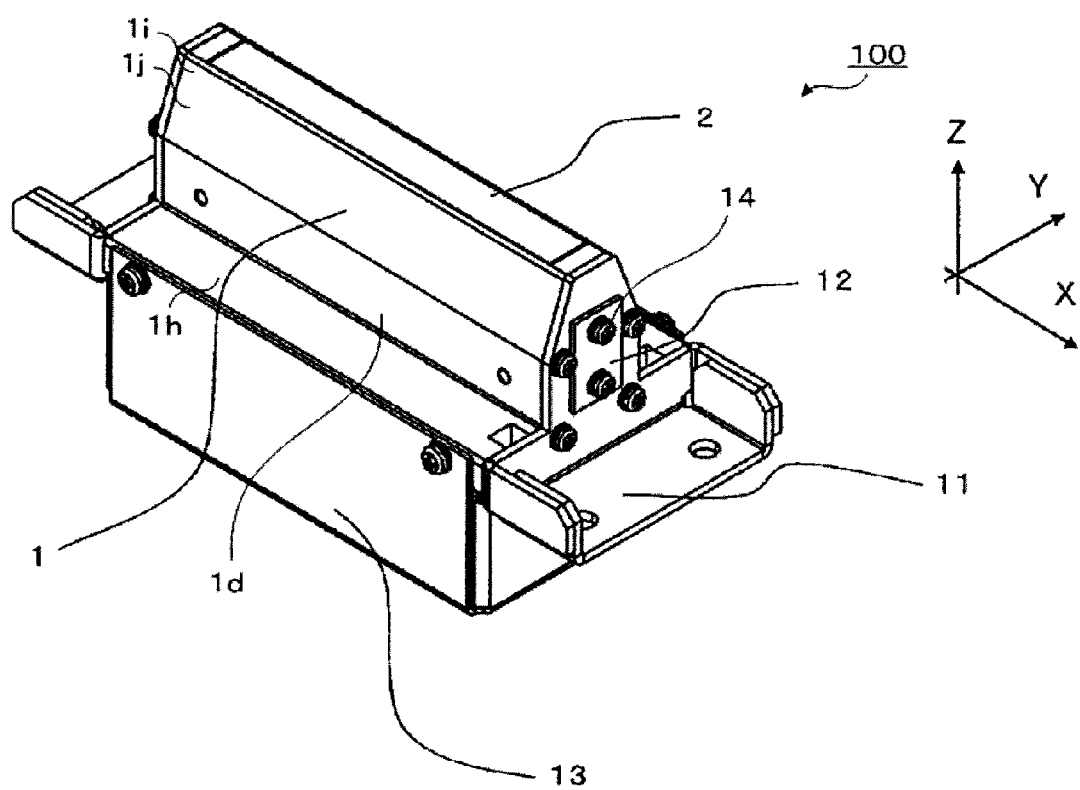
FIG. 2 is an external view of the image sensor according to Embodiment 1.
Figure 3:
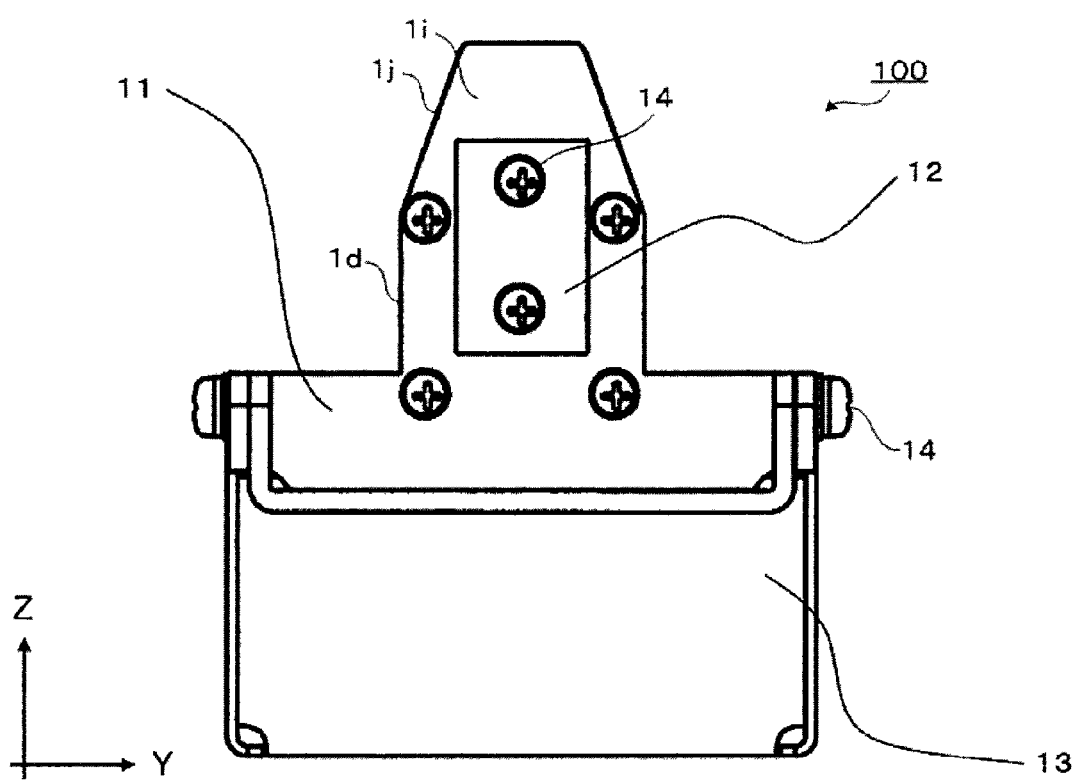
FIG. 3 is a side view of the image sensor according to Embodiment 1 as viewed in the main scanning direction.
Figure 4:
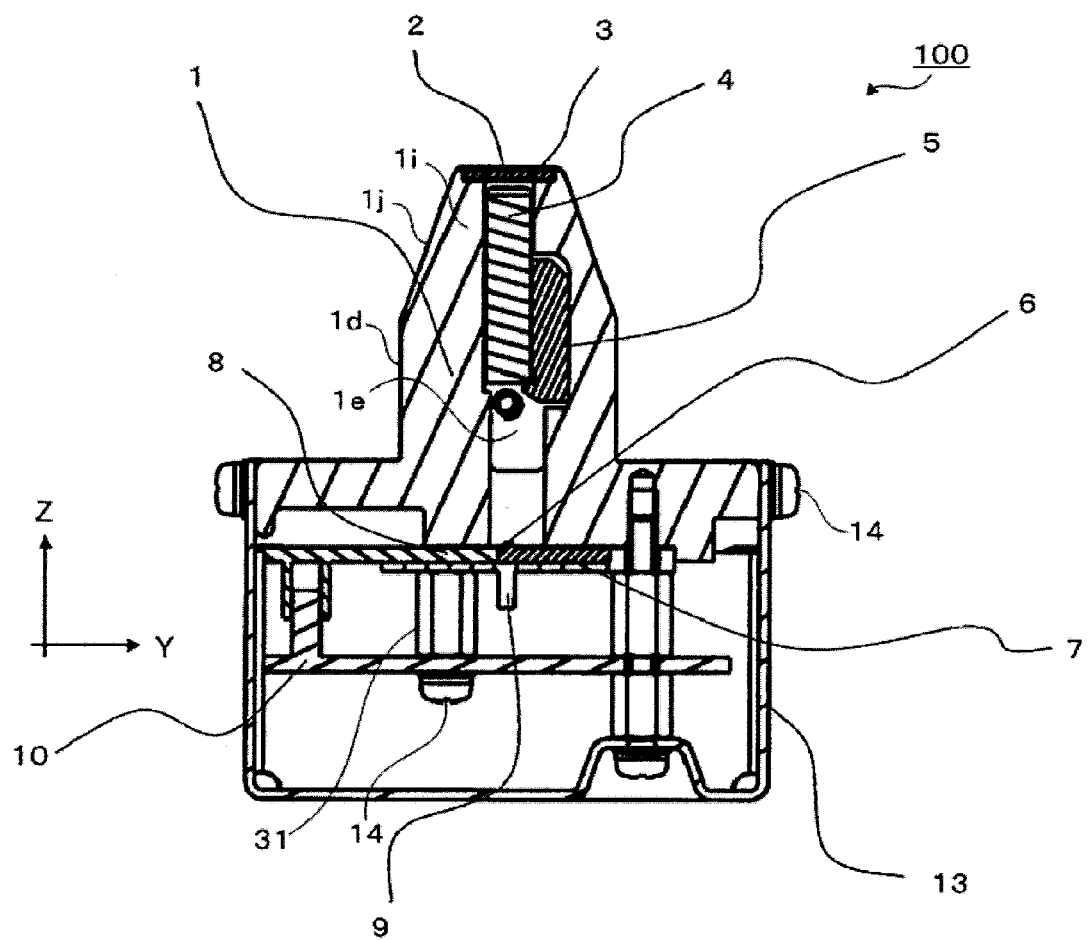
FIG. 4 is a sub-scanning direction cross-sectional view of the image sensor according to Embodiment 1.
Figure 5:
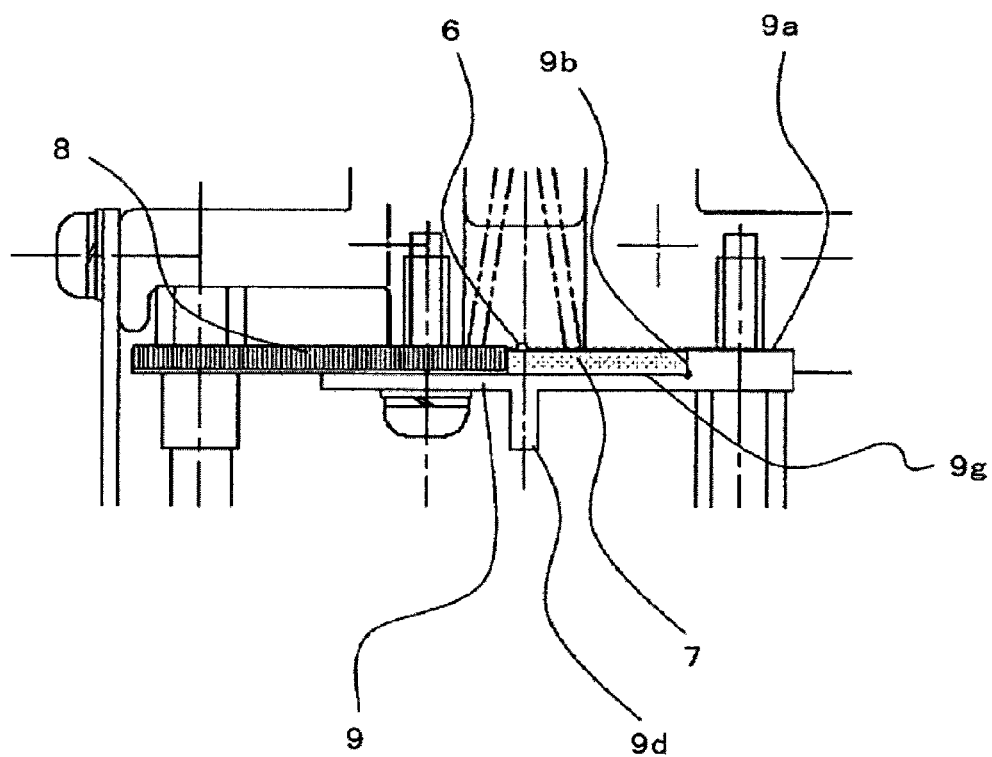
FIG. 5 is a magnified view of a board retaining plate of FIG. 4.

FIG. 1 is an exploded view of the image sensor according to Embodiment 1. FIG. 2 is an external view of the image sensor according to Embodiment 1. FIG. 3 is a side view of the image sensor according to Embodiment 1 as viewed in the main scanning direction. FIG. 4 is a sub-scanning direction cross-sectional view of the image sensor according to Embodiment 1. The expression "sub-scanning direction cross section" refers to a plane orthogonal to the main scanning direction. That is to say, the "sub-scanning cross section" is a cross section formed by Y-Z plane. FIG. 5 is a magnified view of a board retaining plate of FIG. 4.

The image sensor 100 includes a first casing 1, a first transparent plate 2, a lens (focusing optical system) 4, a sensor (light receiver) 6, a sensor board 7, a board retaining plate 9, a signal processing board 10 and brackets 11.

The first casing 1 is a frame manufactured by a method such as extrusion molding, injection molding or cutting work using an easily formable material such as a metal or resin. An opening 1f is formed in the +Z side surface of the first casing 1. A stepped portion 1g for supporting the first transparent plate 2 is formed in the edge portion of the opening 1f. The step of the stepped portion 1g is formed as a step shape at least along the X direction. The opening 1f forms an optical path for passage of light. Thus the X direction length of the opening 1f is greater than the scan width, and the Y direction length is greater than the Y direction length of the lens 4. Moreover, a hole is formed extending in the X direction in the first casing 1. The Y direction and the Z direction lengths of the hole are greater than the respective Y direction and Z direction lengths of the lens 4 and lens support plate 5.

The first casing 1 is formed so as to have a convex shape in a cross section formed by Y-Z plane. The first casing 1 has a planar portion 1h and a projecting portion 1i. A lens containing portion 1e for containing the lens 4 is formed in the projecting portion 1i. The distal tip of the projecting portion 1i supports the first transparent plate 2.

A retention groove for retention of the sensor drive board 8 and the board retaining plate 9 is formed in the −Z side surface of the first casing 1. The retention groove is formed linearly along the X direction. The retention groove is formed at a position shifted in the Y direction. Moreover, a deep groove in the Z direction is formed in the −Z side surface of the first casing 1. This groove is formed with Y and Z direction lengths greater than components mounted on the sensor board 7 so that the first casing 1 does not interfere with the mounted components.

Bracket attaching holes 1a are formed in the +X and −X side surfaces of the first casing 1. Cover attachment holes 1b are formed in the +Y and −Y side surfaces of the first casing 1. Light source attachment holes 1c are formed in a light source attachment reference surface 1d.

A surface 1j, tilted relative to the X-Z plane, is formed between the light source attachment reference surface 1d of the first casing 1 and the surface for placement and holding of the first transparent plate 2. Thus the cross section formed by Y-Z plane of the projecting portion 1i is formed so as to be narrow toward the +Z side.

The first transparent plate 2 is formed from a material such as glass or resin. The first transparent plate 2 functions as a cover for covering the opening 1f. The first transparent plate 2 is formed from a transparent material in order to suppress attenuation of light reflected by the object to be read. The object to be read is disposed at the +Z side and separated from the first transparent plate 2. Light passes through the first transparent plate 2 and enters the lens 4.

Moreover, the first transparent plate 2 can be formed from a UV-blocking glass or IR-blocking glass. By being formed from such glass, the first transparent plate 2 can have an optical wavelength selection function by blocking ultraviolet light or infrared light.

The seal 3, both surfaces thereof forming adhesive surfaces, is formed from a sheet-like material. The X and Y direction lengths of the seal 3 are less than those of the stepped portion 1g. An opening portion is formed in the central portion of the seal 3 so as not to block the passage of light through the first transparent plate 2.

The lens 4 is an optical component for focusing light, such as a rod lens array or micro-lens array, or an assembly of such optical components, such as a focusing optical system combining a lens and a group of mirrors. The sensor 6 is a sensor array composed of sensor ICs (photoreceiver elements) for receiving light passing through the lens 4.

Lens 4 is described in Embodiment 1 as a rod lens array. A rod lens array is formed by components such as a frame and numerous rod lenses arrayed in the X direction and arranged to focus an erect, unmagnified image. For simplicity, the illustrations of Embodiment 1 show lens 4 only as a member having an elongated box-like external shape extending in the X direction.

The lens support plate 5 is a plate extending in the X direction for reinforcement of the lens 4.

The sensor board 7 is a board for mounting the sensor 6 and has a size corresponding to the length of the scan width of sensor 6 in the X direction. The sensor board 7 extends in the X direction. The sensor 6 is a photoelectric conversion element. The sensor 6 is connected electrically to the sensor drive board 8 by a method such as wire bonding. The sensor 6 receives light focused by the lens 4 and performs photo-electric conversion. The sensor 6 is driven by the sensor drive board 8 by connecting electrically to the sensor drive board 8. The photo-electrically converted electrical signal is output from the sensor 6 to the sensor drive board 8.

The sensor drive board 8 is a circuit board extending in the X direction. The sensor drive board 8 has a connector 8a capable of connecting to the signal processing board 10. The sensor drive board 8 has a fitting hole 8b for fixing to the first casing 1. The sensor drive board 8 has components such as a circuit for driving the sensor 6 and a pad for connecting to the drive circuit.

The board retaining plate 9 is a plate extending in the X and Y directions. As viewed from the +Z direction, the board retaining plate 9 has a casing attachment surface 9a, a sensor board attachment reference surface 9b, a reinforcing structure 9d, a fitting hole 9e and a fitting hole 9f. The casing attachment surface 9a is formed at the Y-direction edge portion. The casing attachment surface 9a projects from the +Z side. The sensor board attachment reference surface 9b is a surface formed between the casing attachment surface 9a and the main surface 9g. The reinforcing structure 9d projects from the −Z side of the board retaining plate 9. The reinforcing structure 9d extends in the X direction. The sensor 6 is disposed at the +Z side of the reinforcing structure 9d. The casing attachment surface 9a extends in the X direction. The casing attachment surface 9a is parallel to the main surface 9g. The sensor board attachment reference surface 9b is perpendicular to the main surface 9g. The fitting hole 9e is a hole for fixing the board retaining plate 9 to the first casing 1. The fitting hole 9e is arranged in the casing attachment surface 9a. The fitting holes 9f are holes for fixing the board retaining plate 9 and the sensor drive board 8 to the first casing 1. The fitting holes 9f are arranged in the main surface 9g.

Moreover, the reinforcing structure 9d extends in the X direction. Thus twist and strain that occurs in the board retaining plate 9 upon using screws 14 to fix the board retaining plate 9 to the first casing 1 can be suppressed. Moreover, deflection that occurs in the board retaining plate 9 in the X direction can be suppressed. Relatively high positional accuracy of the sensor 6 and the first casing 1 can be secured by this means.

The signal processing board 10 is a circuit board. This board has a connector 10a capable of connecting to the sensor drive board 8, a light source-driving connector 10b, a connector 10c and fitting holes 10d and 10e. The connector 10a is a connector for connecting to the sensor drive board 8. The connector 10c is not illustrated. The connector 10c is a connector for connecting to external equipment. The signal processing board 10 has fitting holes 10e for fixing to the first casing 1. Moreover, the sensor drive board 8 has a power supply circuit for driving a source 20 and an Application Specific Integrated Circuit (ASIC), which is a signal processing circuit. As may be required, the signal processing board 10 and the sensor drive board 8 can be combined.

The brackets 11 are approximately L-shaped components that have a surface parallel to the Y-Z plane and a surface parallel to the X-Z. The brackets 11 are formed from a plate-shaped material such as metal plate. The brackets 11 have casing fitting holes 11a and sealing plate fitting holes 11b in the surface parallel to the Y-Z plane. The surface of the brackets 11 parallel to the Y-Z plane is formed in a surface area that is the same or larger than the area of the openings formed in the +X side and the −X side of the first casing 1. After assembly with the first casing 1, the surface parallel to the Y-Z plane of the brackets 11 can thus cover the openings of the +X and −X sides of the first casing 1. The basic structures of the brackets 11 are approximately L-shaped, and in order to have the necessary strength, can be provided with a reinforcing structure such as a box-like structure.

The sealing plate 12 is a plate component that has a surface parallel to the Y-Z plane. The sealing plate 12 is formed from a material such as metal plate. The sealing plate 12 has a fitting hole 12a for fixing to the bracket 11.

A cover 13 is a box that has an opening at the +Z side thereof. The cover 13 is formed from a metal plate or a molded article. The cover 13 has a fitting hole 13a.

A screw 14 or a spacer screw 31 is used as the fastening component in Embodiment 1. That is to say, the screws 14 or the spacer screws 31 are used to fasten the lens support plate 5, sensor drive board 8, board retaining plate 9, signal processing board 10, cover 13 and bracket 11 to the first casing 1. The screw 14 or spacer screw 31 is also used to fasten together the bracket 11 and sealing plate 12. Needless to say, as for the screw 14 or spacer screw 31, fastening strength suitable for strength required for each fastening point and number of the screw 14 or spacer screw 31 are required to be optimized.

The method of manufacturing the image sensor 100 of Embodiment 1 is explained next.

The seal 3 is used to fix the first transparent plate 2 to the opening 1f.

The lens support plate 5 and the lens 4 are adhered using a means such as adhesive or double-sided tape. Neither the lens support plate 5 nor the lens 4 is necessary to be a single component, and a structure can be used in that multiple such components are combined. The lens support plate 5 supporting the lens 4 is inserted in and retained by the first casing 1. In such configuration, the focal point of the lens 4 can be made to coincide with the location of the conveyed surface of the object to be read.

The sensor board 7 and the sensor drive board 8 are attached to the board retaining plate 9. By such attachment, the sensor board 7 and the sensor drive board 8 are retained at the +Z side of the board retaining plate 9. The sensor board 7 is adhered to the retaining plate 9 by a means such as adhesive or tape. During adhesion of the sensor board 7 to the board retaining plate 9, the sensor board 7 and board retaining plate 9 are secured with high positional accuracy relatively in the Y and Z directions, because the +Y side surface of the sensor board 7 is in contact with the sensor board attachment reference surface 9b. The sensor 6 is mounted on the sensor board 7. The sensor drive board 8 is arranged parallel to the sensor board 7, because it is in contact with the main surface 9g of the board retaining plate 9. Furthermore, after arranging the fitting holes 9f and the fitting holes 8b to be overlapped in the Z direction, the sensor drive board 8 is adhered using a means such as adhesive or tape.

The sensor drive board 8 is retained by the first casing 1 with the spacer screws 31 inserted into the fitting holes 8b and fitting holes 9f. Thus even when the connector 8a is attached to and detached from the light source-driving connector 10b, the assembled state of the sensor drive board 8 and the first casing 1 is not changed. Thus the assembled state of the sensor drive board 8 and the first casing 1 is stable. The board retaining plate 9 is fixed to the first casing 1 with the spacer screws 31 inserted into the fitting hole 9e and fitting holes 9f.

The fitting hole 9e is formed at the +Y side of the sensor 6. The fitting hole 9f is formed at the −Y side of the sensor 6. In the Y direction, the sensor 6 is disposed at an intermediate position between the fitting hole 9e and the fitting hole 9f. The board retaining plate 9 is affected by tension from the spacer screw 31 inserted in the fitting hole 9e. The board retaining plate 9 is affected by tension from the spacer screws 31 inserted in the fitting holes 9f. The board retaining plate 9 is thus retained facing the +Z side. Thus the sensor 6 is retained by the board retaining plate 9 facing the +Z side. Even when the sensor board 7 and the board retaining plate 9 are fixed to the first casing 1 with the spacer screws 31, the sensor 6 is hardly affected by tension during fastening of the spacer screws 31. Thus characteristics of the sensor 6 are not changed by tension during fastening. Thus the sensor 6 is retained stably. Furthermore, the means for fixing the sensor board 7 and board retaining plate 9 to the first casing 1 is not limited to the spacer screws 31, and means can be used such as fitting with a rivet or gluing.

By fitting connector 10a into the connector 8a, the signal processing board 10 is connected electrically to the sensor drive board 8. The fitting hole 10*d* and the fitting hole 9*e* are overlapped in the Z direction. By inserting the screw 14 into the fitting hole 10*d* and the screw hole of the spacer screw 31 inserted in the fitting hole 9*e*, the board retaining plate 9 and the signal processing board 10 are fastened together. Furthermore, the fitting holes 10*e* and the fitting holes 9*f* are overlapped in the Z direction. By inserting the screws 14 into the fitting holes 10*e* and the screw holes of the spacer screws 31 inserted in the fitting holes 9*f*, the board retaining plate 9 and the signal processing board 10 are fastened together strongly. Thus the signal processing board 10 is fixed to the first casing 1 indirectly. Needless to say, when the signal processing board 10 and the sensor drive board 8 are integrated as a single board, the signal processing board 10 is fixed by fixing the sensor drive board 8 to the first casing 1.

The brackets 11 are fixed to the first casing 1 by inserting the screws 14 in the casing fitting holes 11*a* and the bracket attaching holes 1*a* of the first casing 1.

The sealing plate 12 is fixed to the bracket 11 by inserting the screws 14 in the fitting holes 12*a* and the sealing plate fitting holes 11*b* of the bracket 11.

The cover 13 is fixed to the first casing 1 by inserting the screws 14 in the fitting holes 13*a* and the cover attachment holes 1*b* of the first casing 1.

Figure 6:
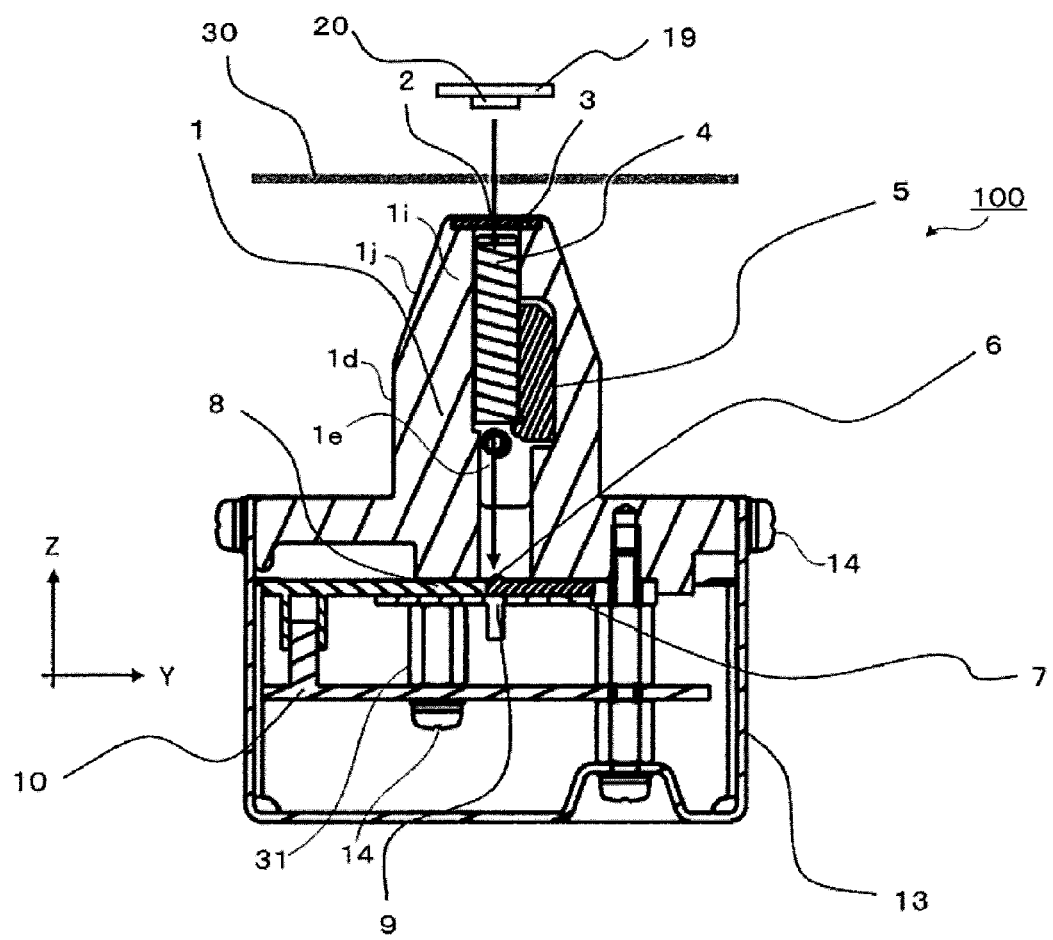
FIG. 6 is a drawing that illustrates an example optical path of the image sensor according to Embodiment 1.

Next, the flow of image information in Embodiment 1 is explained. FIG. 6 is a drawing that illustrates an example optical path of the image sensor according to Embodiment 1. The light source 20 is disposed facing the image sensor 100 so as to sandwich the object to be read 30 therebetween. Light from the light source 20 passes through the object to be read 30 and is incident on the image sensor 100. The light incident on the image sensor 100 passes through the first transparent plate 2, and is focused through the lens 4 onto the sensor 6. Thus image information of the object to be read 30 is focused as light on the sensor 6. The photoelectrically converted light is sent from the sensor 6, passes through the sensor drive board 8, arrives at the signal processing board 10, passes through the connector 10*c*, and is output to equipment external to the image sensor 100. Thus the image information of the object to be read 30 is output as an electrical signal to the equipment external to the image sensor 100. Although the case of disposing the light source 20 relative to the object to be read 30 at the same side of the image sensor 100 differs in that the light irradiated from the light source 20 reflects from the object to be read 30 and is incident on the image sensor 100, operation after entering the image sensor 100 is the same.

Next, the effect of Embodiment 1 is explained. The board retaining plate 9 is affected by tension caused by the spacer screws 31 inserted in the fitting holes 9*e*. The board retaining plate 9 is affected by tension caused by the spacer screws 31 insert in the fitting holes 9*f*. Thus the board retaining plate 9 is retained facing the +Z side. Thus the sensor board 7 and the sensor 6 are retained facing the +Z side by the board retaining plate 9. Even when the sensor board 7 and the board retaining plate 9 are fixed to the first casing 1 with the spacer screws 31, the sensor 6 is hardly affected by tension during tightening of the spacer screws 31. The +Y side surface of the sensor board 7 is in contact with the sensor board attachment reference surface 9*b*. The spacer screws 31 are inserted in the fitting holes 9*e* and fitting holes 9*f*. Thus the sensor board 7 and the board retaining plate 9 become retained with high positional accuracy relatively in the Y and Z directions. Effectively the sensor board 7 and the sensor 6 become retained by the first casing 1 and board retaining plate 9 in a state in which positions are determined with high accuracy in the Y and Z directions. The sensor drive board 8 is retained by the first casing 1 with the spacer screws 31 inserted in the fitting holes 8*b* and the fitting holes 9*f*. Thus even when the connector 8*a* is connected to and disconnected from the light source-driving connector 10*b*, there is no change in the assembled state of the sensor drive board 8 and the first casing 1. Thus the assembled state of the sensor drive board 8 and the first casing 1 is stable. Moreover, when the signal processing board 10 is fastened with the spacer screws 31 to the board retaining plate 9, the signal processing board 10 extends further than the board retaining plate 9 toward the +Y side. This results in a structure in which electrical components including the connector 10*a*, on the +Y side of the signal processing board 10, can be mounted on either or both of the front and the backside.

Moreover, the reinforcing structure 9*d* projects to the −Z side of the board retaining plate 9. By this means, although compact, the board retaining plate 9 can be sufficiently stiff to retain the sensor 6 with good accuracy in the Z direction.

Next, the dust-proofing effect of the image sensor 100 of Embodiment 1 is explained. The opening 1*f* is sealed by the first transparent plate 2. The −Z side opening of the first casing 1 is sealed by the sensor drive board 8 and the board retaining plate 9. The X direction holes of the first casing 1 are sealed by the brackets 11 and the sealing plates 12. That is to say, because a sealed configuration is used for all the openings formed in the first casing 1, a high dust-proofing effect can be secured for the lens 4 and the sensor 6 of the interior of the first casing 1.

The light source 20 is mounted in contact with the light source attachment reference surface 1*d*, which has light source attachment holes 1*c*, and the +Z side surface of the planar portion 1*h*. The surface 1*j* is tilted relative to the X-Z plane. Thus the projecting portion 1*i* is formed so that a cross section formed by Y-Z plane toward the +Z side becomes narrower. By this means, the angle of incidence of light irradiated from the light source 20 onto the object to be read 30 can be a large value, and thus the light source 20 can be positioned more freely. For example, when direct light illumination is required, the light source 20 can be placed near the first casing 1 to make the angle of incidence to be a small value. Conversely, when illumination by scattered light is required, the light source 20 can be positioned away from the first casing 1 to make the angle of incidence to be a large value. Moreover, when increase of illumination intensity of the light source 20 is required, the light source 20 can be positioned near the object to be read 30. Furthermore, if ripple (deviations) occurs when using light sources arranged in an array-like manner, the light source 20 can be positioned away from the object to be read 30.

Embodiment 2

The structure of the image sensor and the method of manufacturing the image sensor are explained for Embodiment 2 of this disclosure.

Embodiment 2 is explained below using FIGS. 7-14. The X-Y-Z orthogonal coordinate system used in Embodiment 2 is defined in the following manner. The main scanning direction of the image sensor 200 is defined to be the X axis, and the sub-scanning direction is defined to be the Y axis. The Z axis is defined to be the direction orthogonal to the X axis and Y axis. The object to be read is disposed in the Z axis direction of the image sensor 200. The direction from the image sensor 200 to the object to be read is defined to be the positive direction of the Z axis. Hereinafter, the main scanning direction is referred to as the X direction, and the sub-scanning direction is referred to as the Y direction. The Z direction is the direction of focal depth. The object-to-beread side of the image sensor 200 is referred to as the +Z side, and the opposite side is referred to as the −Z side. Similarly, the side in one direction along the main scanning direction is referred to as the +X side, and the side in the other direction is referred to as the −X side. Moreover, the side in one direction along the sub-scanning direction is referred to as the +Y side, and the side in the other direction is referred to as the −Y side. Furthermore, in Embodiment 2, the expression "scan width of the image sensor 200" refers to the linear length capable of being scanned by the image sensor 200. More specifically, the "scan width" is the linear length along the main scanning direction. In the figures, parts that are identical or equivalent to one another are indicated by the same reference sign.

Figure 7:
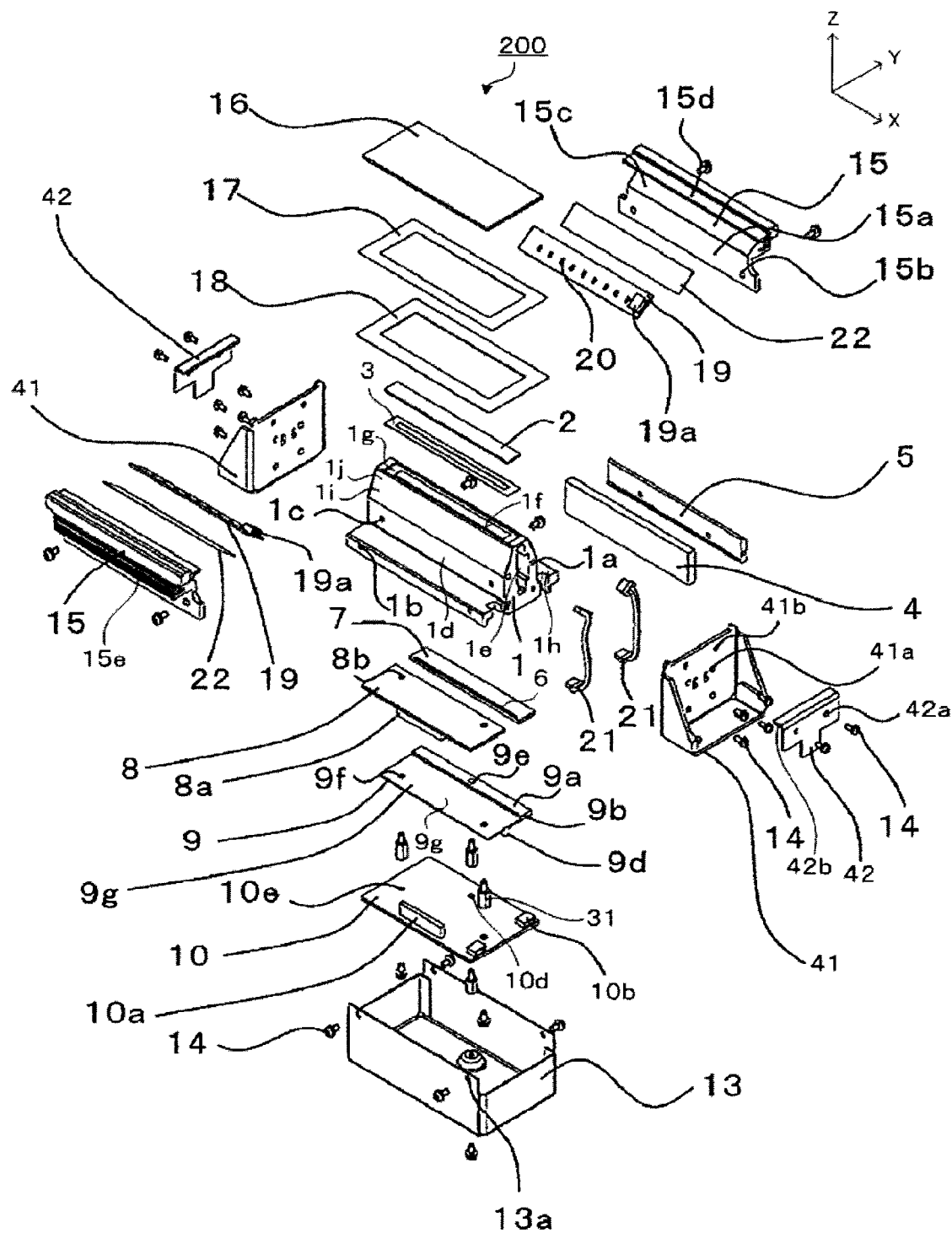
FIG. 7 is an exploded view of an image sensor according to Embodiment 2 of this disclosure.
Figure 8:
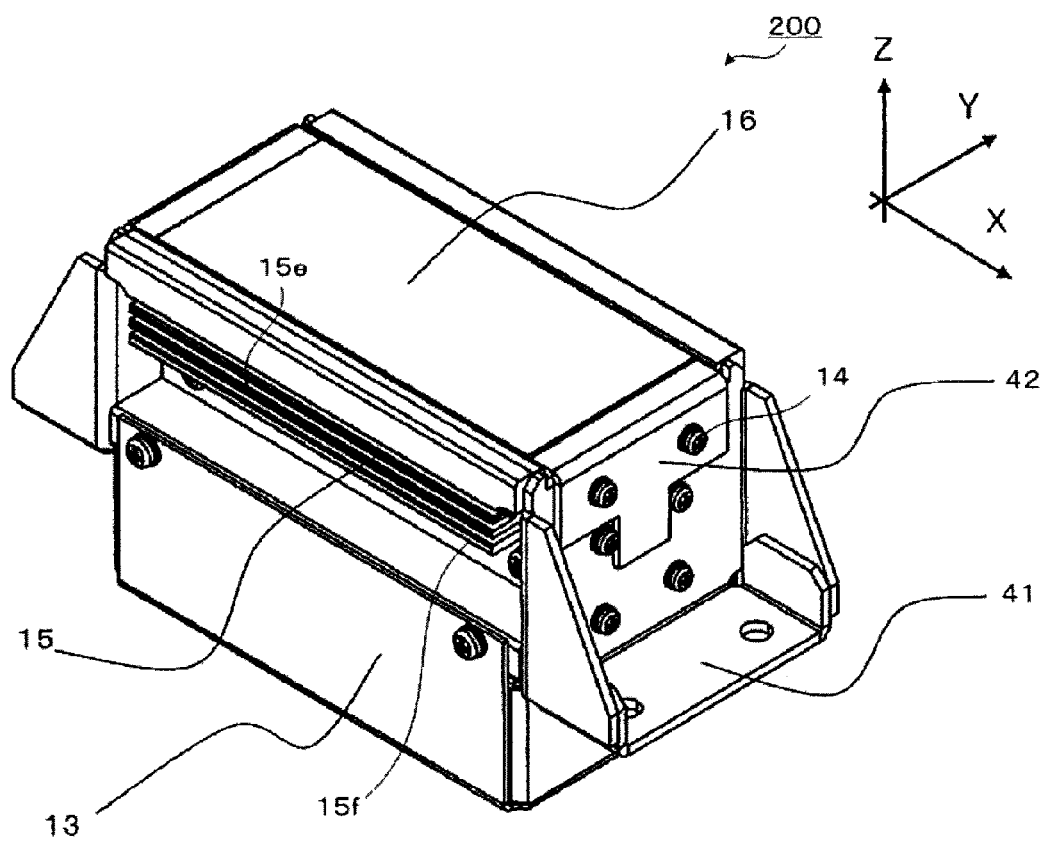
FIG. 8 is a perspective view of the image sensor according to Embodiment 2.
Figure 9:
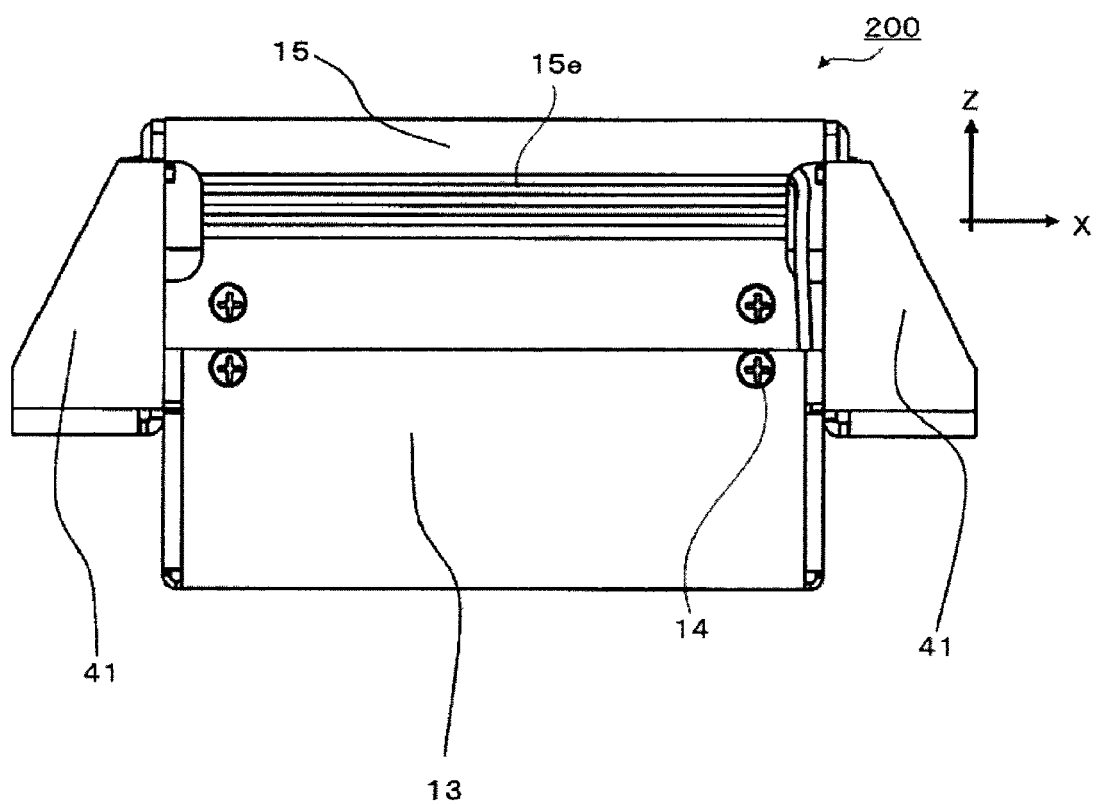
FIG. 9 is a side view of the image sensor according to Embodiment 2 as viewed in the sub-scanning direction.
Figure 10:
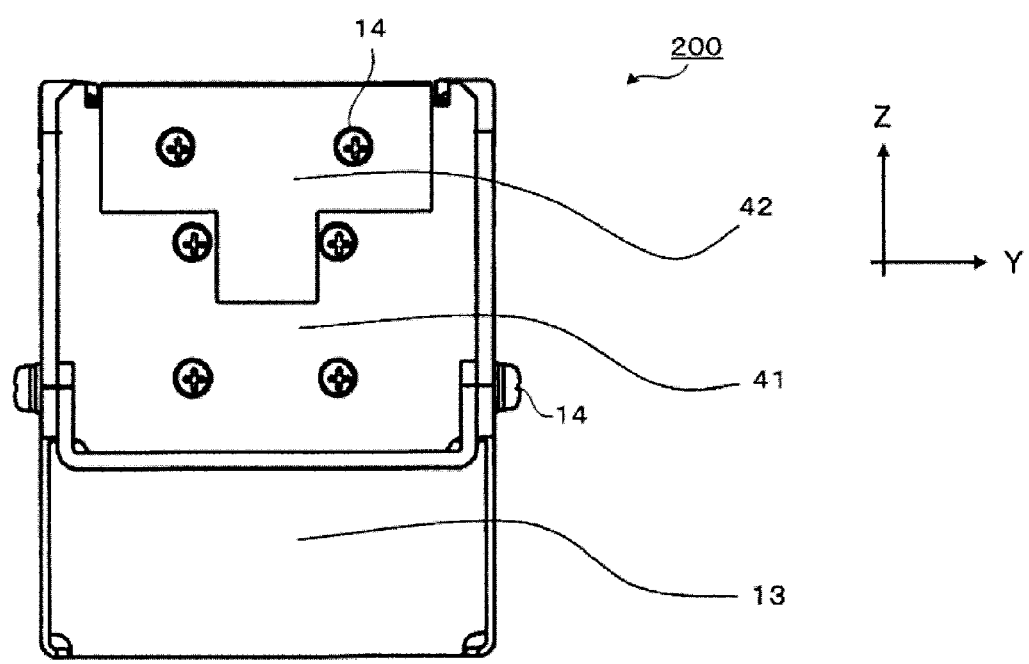
FIG. 10 is a side view of the image sensor according to Embodiment 2 as viewed in the main scanning direction.
Figure 11:
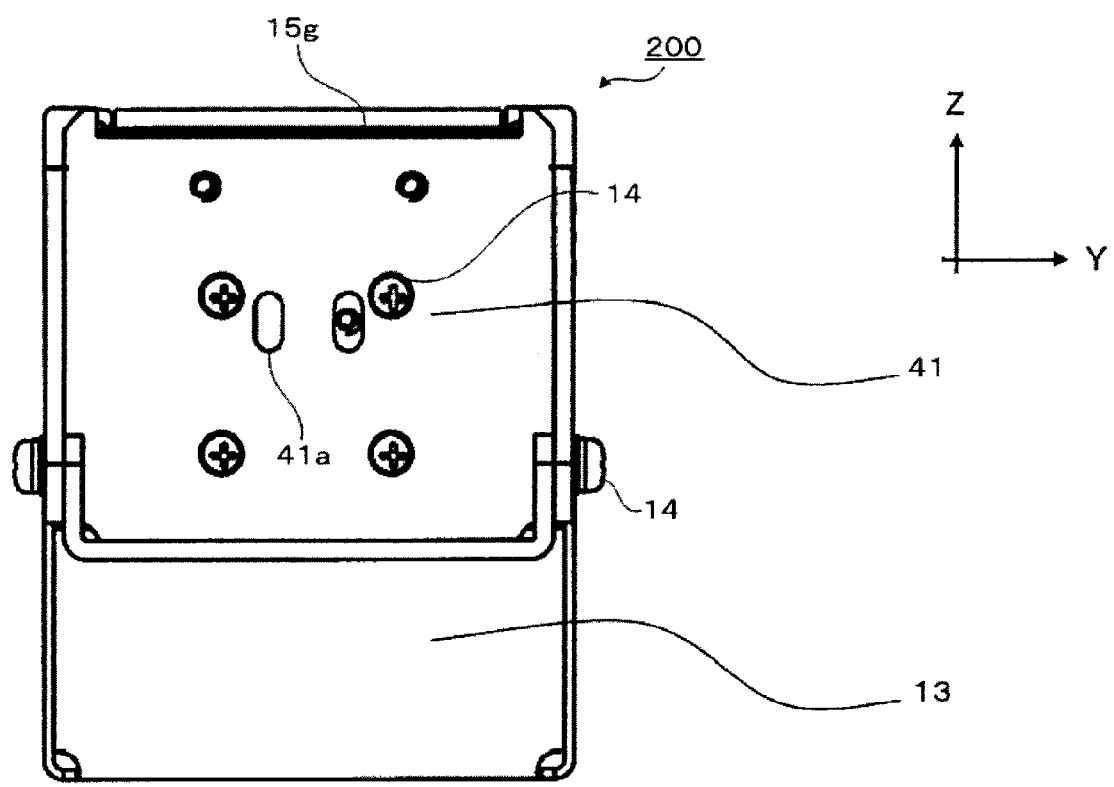
FIG. 11 is a side view as viewed in the main scanning direction of the image sensor according to Embodiment 2 when the sealing plate of the image sensor is removed.
Figure 12:
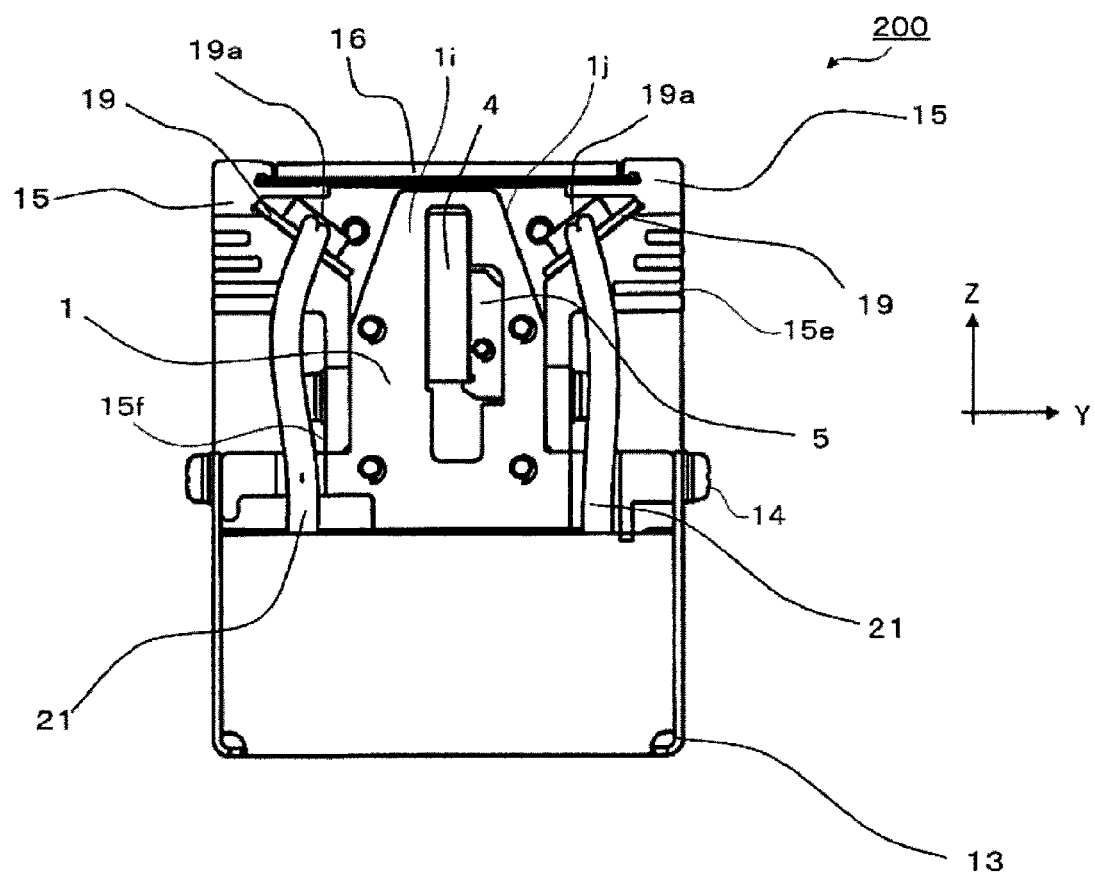
FIG. 12 is a side view as viewed in the main scanning direction of the image sensor according to Embodiment 2 when the brackets of the image sensor are removed.
Figure 13:
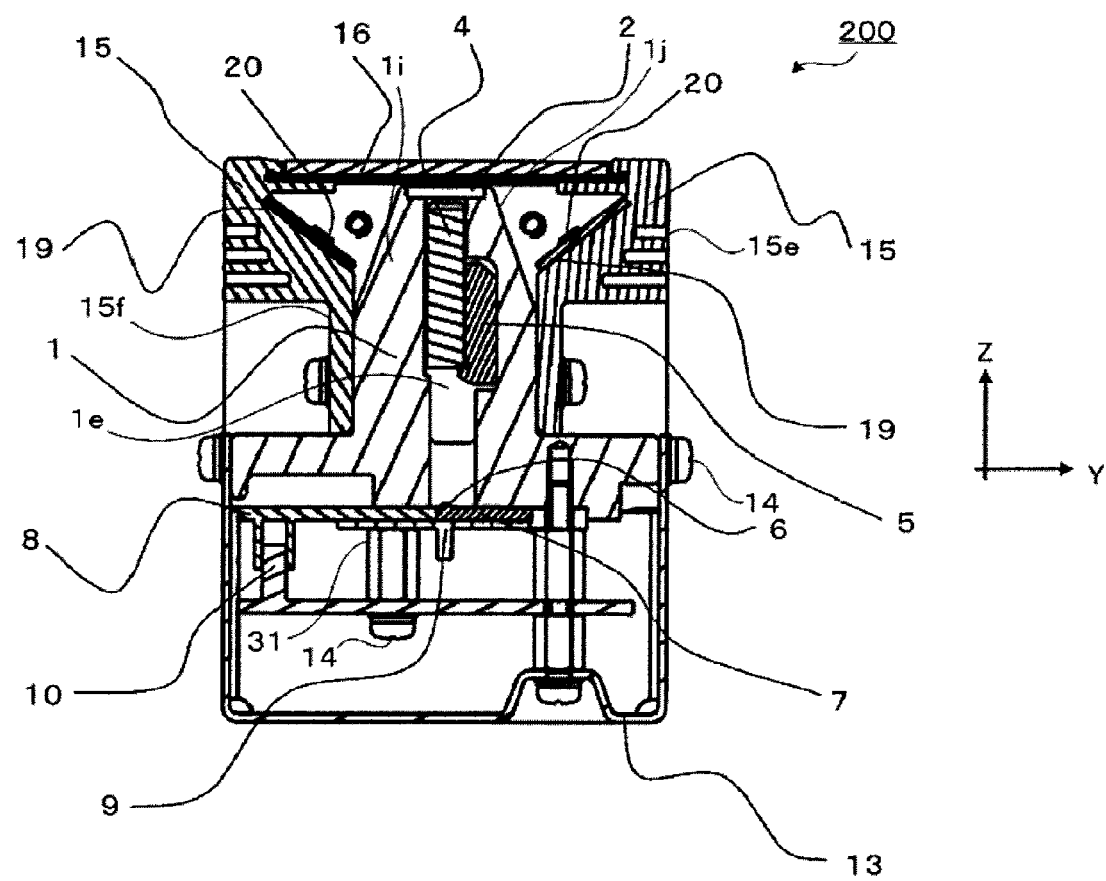
FIG. 13 is a sub-scanning direction cross-sectional view of the image sensor according to Embodiment 2.
Figure 14:
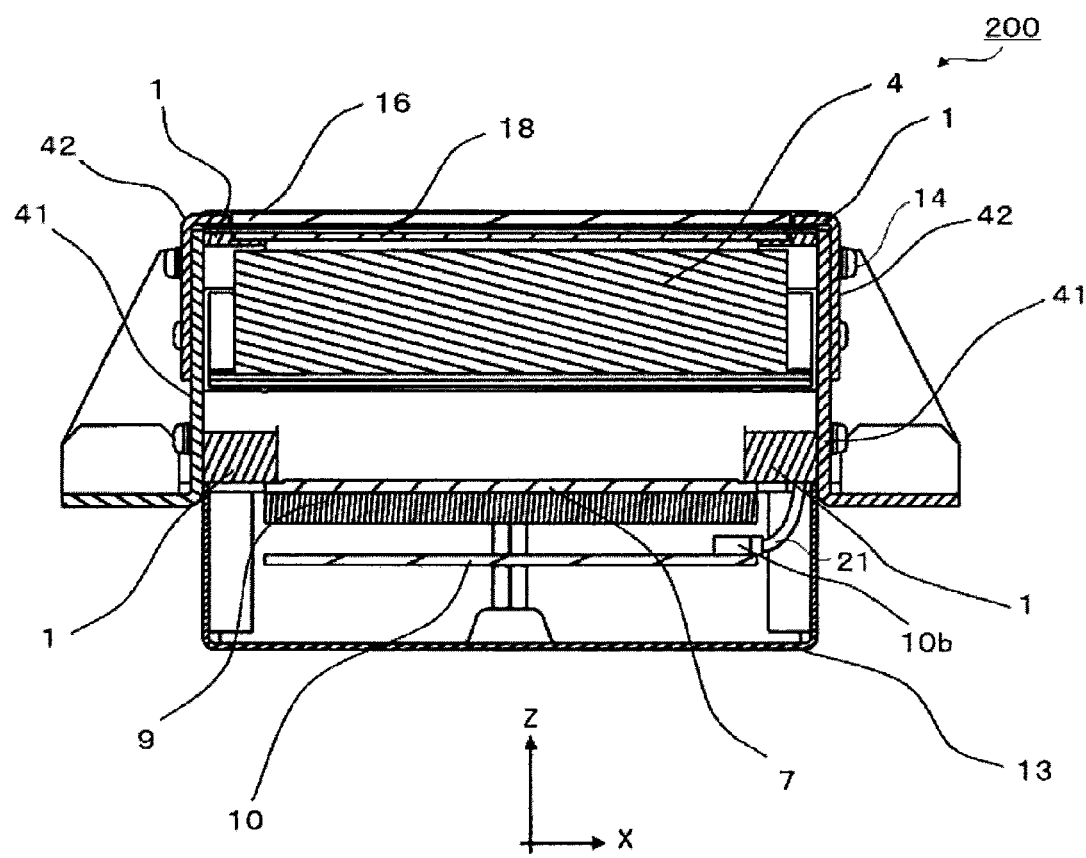
FIG. 14 is a main scanning direction cross-sectional view of the image sensor according to Embodiment 2.

FIG. 7 is an exploded view of an image sensor according to Embodiment 2. FIG. 8 is a tilted perspective view of the image sensor according to Embodiment 2. FIG. 9 is a side view of the image sensor according to Embodiment 2 as viewed in the sub-scanning direction. FIG. 10 is a side view of the image sensor according to Embodiment 2 as viewed in the main scanning direction. FIG. 11 is a side view as viewed in the main scanning direction of the image sensor according to Embodiment 2 when the sealing plate of the image sensor is removed. FIG. 12 is a side view as viewed in the main scanning direction of the image sensor according to Embodiment 2 when the brackets of the image sensor are removed. FIG. 13 is a sub-scanning direction cross-sectional view of the image sensor according to Embodiment 2. The expression "sub-scanning direction cross section" refers to a plane orthogonal to the main scanning direction. That is to say, the "sub-scanning cross section" is a cross section formed by a Y-Z plane. FIG. 14 is a main scanning direction cross-sectional view of the image sensor according to Embodiment 2. The expression "main scanning direction cross section" refers to the plane orthogonal to the sub-scanning direction. That is to say, the "main scanning cross section" is a cross section formed by an X-Z plane.

The image sensor 200 includes a first casing 1, a first transparent plate 2, a lens (focusing optical system) 4, a sensor (light receiver) 6, a sensor board 7, a board retaining plate 9, a signal processing board 10, brackets 41, sealing plates 42, second casings 15 having a heat dissipation surface (heat dissipation fin) 15e, a second transparent plate 16 and a light source 20.

The first casing 1 is a frame manufactured by a method such as extrusion molding, injection molding or cutting work using an easily formable material such as a metal or resin. An opening 1f is formed in the +Z side surface of the first casing 1. A stepped portion 1g for supporting the first transparent plate 2 is formed in the edge portion of the opening 1f. The step of the stepped portion 1g is formed as a step shape at least along the X direction. The opening 1f forms an optical path for passage of light. Thus the X direction length of the opening 1f is greater than the scan width, and the Y direction length is greater than the Y direction length of the lens 4. Moreover, a hole is formed extending in the X direction in the first casing 1. The Y direction and the Z direction lengths of the hole are greater than the respective Y direction and Z direction lengths of the lens 4 and lens support plate 5.

The first casing 1 is formed so as to have a convex shape in a cross section formed by Y-Z plane. The first casing 1 has a planar portion 1h and a projecting portion 1i. A lens containing portion 1e for containing the lens 4 is formed in the projecting portion 1i. The distal tip of the projecting portion 1i supports the first transparent plate 2.

A retention groove for retention of the sensor drive board 8 and the board retaining plate 9 is formed in the −Z side surface of the first casing 1. The retention groove is formed linearly along the X direction. The retention groove is formed at a position shifted in the Y direction. Moreover, a deep groove in the Z direction is formed in the −Z side surface of the first casing 1. This groove is formed with Y and Z direction lengths greater than components mounted on the sensor board 7 so that the first casing 1 does not interfere with the mounted components.

Bracket attaching holes 1a are formed in the +X and −X side surfaces of the first casing 1. Cover attachment holes 1b are formed in the +Y and −Y side surfaces of the first casing 1. Light source attachment holes 1c are formed in a light source attachment reference surface 1d.

A surface 1j, tilted relative to the X-Z plane, is formed between the light source attachment reference surface 1d of the first casing 1 and the surface holding the first transparent plate 2. Thus the cross section formed by Y-Z plane of the projecting portion 1i is formed so as to be narrow toward the +Z side.

The first transparent plate 2 is formed from a material such as glass or resin. The first transparent plate 2 functions as a cover for covering the opening 1f. The first transparent plate 2 is formed from a transparent material in order to suppress attenuation of light reflected by the object to be read. The object to be read is disposed at the +Z side and separated from the first transparent plate 2. Light passes through the first transparent plate 2 and enters the lens 4.

Moreover, the first transparent plate 2 can be formed from a UV-blocking glass or IR-blocking glass. By being formed from such glass, the first transparent plate 2 can have an optical wavelength selection function by blocking ultraviolet light or infrared light.

The seal 3, both surfaces thereof forming adhesive surfaces, is formed from a sheet-like material. The X and Y direction lengths of the seal 3 are less than those of the stepped portion 1g. An opening portion is formed in the central portion of the seal 3 so as not to block the passage of light through the first transparent plate 2.

The lens 4 is an optical component for focusing and coupling light, such as a rod lens array or micro-lens array, or an assembly of such optical components, such as a focusing optical system combining a lens and a group of mirrors. The sensor 6 is a sensor array composed of sensor ICs (photoreceiver elements) for receiving light passing through the lens 4.

Lens 4 is described in Embodiment 2 as a rod lens array. A rod lens array is formed by components such as a frame and numerous rod lenses arrayed in the X direction and arranged to focus an erect, unmagnified image. For simplicity, the illustrations of Embodiment 2 show lens 4 only as a member having an elongated box-like external shape extending in the X direction.

The lens support plate 5 is a plate extending in the X direction for reinforcement of the lens 4.

The sensor board 7 is a board for mounting the sensor 6 and has a size corresponding to the length of the scan width of sensor 6 in the X direction. The sensor board 7 extends in the X direction. The sensor 6 is a photoelectric conversion element. The sensor 6 is connected electrically to the sensor drive board 8 by a method such as wire bonding. The sensor 6 receives light focused by the lens 4 and performs photoelectric conversion. The sensor 6 is driven by the sensor drive board 8 by connecting electrically to the sensor drive board 8. The photo-electrically converted electrical signal is output from the sensor 6 to the sensor drive board 8.

The sensor drive board 8 is a circuit board extending in the X direction. The sensor drive board 8 has a connector 8a capable of connecting to the signal processing board 10. The sensor drive board 8 has a fitting hole 8b for fixing to the first casing 1. The sensor drive board 8 has components such as a circuit for driving the sensor 6 and a pad for connecting to the drive circuit.

The board retaining plate 9 is a plate extending in the X and Y directions. As viewed from the +Z direction, the board retaining plate 9 has a casing attachment surface 9a, a sensor board attachment reference surface 9b, a reinforcing structure 9d, a fitting hole 9e and a fitting hole 9f. The casing attachment surface 9a is formed at the Y-direction edge portion. The casing attachment surface 9a projects from the +Z side. The sensor board attachment reference surface 9b is a surface formed between the casing attachment surface 9a and the main surface 9g. The reinforcing structure 9d projects from the −Z side of the board retaining plate 9. The reinforcing structure 9d extends in the X direction. The sensor 6 is disposed at the +Z side of the reinforcing structure 9d. The casing attachment surface 9a extends in the X direction. The casing attachment surface 9a is parallel to the main surface 9g. The sensor board attachment reference surface 9b is perpendicular to the main surface 9g. The fitting hole 9e is a hole for fixing the board retaining plate 9 to the first casing 1. The fitting hole 9e is arranged in the casing attachment surface 9a. The fitting holes 9f are holes for fixing the board retaining plate 9 and the sensor drive board 8 to the first casing 1. The fitting holes 9f are arranged in the main surface 9g.

Moreover, the reinforcing structure 9d extends in the X direction. Thus twist and strain that occurs in the board retaining plate 9 upon using screws 14 to fix the board retaining plate 9 to the first casing 1 can be suppressed. Moreover, deflection that occurs in the board retaining plate 9 in the X direction can be suppressed. Thus relatively high positional accuracy of the sensor 6 and the first casing 1 is secured.

The signal processing board 10 is a circuit board. This board has a connector 10a capable of connecting to the sensor drive board 8, a light source-driving connector 10b, a connector 10c and fitting holes 10d and 10e. The connector 10a is a connector for connecting to the sensor drive board 8. The connector 10c is not illustrated. The connector 10c is a connector for connecting to external equipment. The signal processing board 10 has fitting holes 10e for fixing to the first casing 1. Moreover, the sensor drive board 8 has a power supply circuit for driving the light source 20 and an ASIC (Application Specific Integrated Circuit), which is a signal processing circuit. As may be required, the signal processing board 10 and the sensor drive board 8 can be combined.

The brackets 41 are approximately L-shaped components that have a surface parallel to the Y-Z plane and a surface parallel to the X-Z plane. The brackets 41 are formed from a plate-shaped material such as metal plate. The brackets 41 have casing fitting holes 41a and sealing plate fitting holes 41b in the surface parallel to the Y-Z plane. When the second casing 15 is attached to the first casing 1, openings are formed in the +X side and −X side of the second casing 15. The surface of the brackets 41 parallel to the Y-Z plane is formed to have a surface area that is the same or larger than the area of the openings formed in the +X side and the −X side of the second casing 15. By this means, the brackets 41 can cover the +X and −X sides of the space formed within the second casing 15 while leaving openings 15g formed in the second casing 15 uncovered. The openings 15g are formed at the +X and −X sides of the second casing 15. The openings 15g are formed further to the +Z side than the first casing 1. Together with the sealing plate 42, the brackets 41 cover the +X and −X sides of the second casing 15. The basic structures of the brackets 41 are approximately L-shaped, and in order to have the necessary strength, can be provided with a reinforcing structure such as a box-like structure.

The sealing plate 42 is an approximately L-shaped component that has a surface parallel to the Y-Z plane and a surface parallel to the X-Y plane. The sealing plate 42 is formed from a plate component composed of a material such as metal or resin. The sealing plate 42 has fitting holes 42a and a glass pressing surface 42b. The fitting holes 42a are holes for fixing the sealing plate 42 to the surface of the bracket 41 parallel to the Y-Z plane, and the Y-Z coordinates match those of the sealing plate fitting holes 41b. The glass pressing surface 42b is a surface at the −Z side of the sealing plate 42 and is parallel to the X-Y plane. The glass pressing surface 42b is continuous with the surface of the sealing plate 42 parallel to the Y-Z plane. Moreover, the Y direction length of the glass pressing surface 42b is equivalent to the Y direction length of the second transparent plate 16. Z direction length of the glass pressing surface 42b is equal to one half of the difference between the Z direction lengths of the second transparent plate 16 and plate 18.

The cover 13 is a box that has an opening at the +Z side thereof. The cover 13 is formed from a material such as metal plate or a molded article. The cover 13 has a fitting hole 13a.

The second casing 15 is a columnar component manufactured by a method such as extrusion molding, injection molding or cutting work using an easily formable material such as a metal or resin. The second casing 15 extends in the X direction. The second casing 15 has a first casing attaching surface 15a, first casing attaching holes 15b, a light source board attaching surface 15c, a glass attaching surface 15d and a heat dissipation surface 15e.

The first casing attaching surface 15a is parallel to the light source attachment reference surface 1d. The first casing attaching holes 15b are arranged in the first casing attaching surface 15a. The first casing attaching holes 15b and the light source attachment holes 1c are overlapped in the Y direction. The light source board attaching surface 15c is continuous with the first casing attaching surface 15a. The light source board attaching surface 15c extends in the X direction at an angle relative to the first casing attaching surface 15a. When the angle formed between the light source board attaching surface 15c and the first casing attaching surface 15a is defined to be θ, then 90°<θ<180°. When the direction of irradiation of the light source 20 is perpendicular to the light source board attaching surface 15c, the angle of incidence on the object to be read is 180-θ. The glass attaching surface 15d is parallel to the −Z side surface of the first transparent plate 2. The glass attaching surface 15d is formed with sufficient surface area for supporting the second transparent plate 16 and plate 18. In order not to block the optical path from the light source 20 to the object to be read, the glass attaching surface 15d does not extend to the +Z side of the light source board attaching surface 15c.

The heat dissipation surface 15e is a surface positioned at the Y direction backside of the light source board attaching surface 15c. The heat dissipation surface 15e is a surface formed with fm-shaped projecting portions. The fins of the heat dissipation surface 15e project in the Y direction. Heat generated by the light source 20 is dissipated into the atmosphere by the heat dissipation surface 15e. Properties such as number, length, width and pitch of the fins of the heat dissipation surface 15e can be optimized according to the amount of heat generated by the light source 20 and design conditions such as limitations on the external shape of the image sensor 200.

The second transparent plate 16, for example, is formed from glass or resin. The second transparent plate 16 functions as a cover for covering the opening of the +Z side opening of the second casing 15. The second transparent plate 16 is formed from a transparent material in order to suppress attenuation of light reflected by the object to be read. The object to be read is disposed at the +Z side of the second transparent plate 16.

The seal 17, both surfaces thereof forming adhesive surfaces, is formed from a sheet-like material. The X and Y direction lengths of the seal 17 are less than those of the plate 18. An opening portion is formed in the central portion of the seal 17 so as not to block the passage of light through the second transparent plate 16.

The plate 18 is fabricated by molding resin. The plate 18 is a sheet-like or plate-like component. The plate 18 is formed such that lengths thereof are less than the X and Y directions lengths of the glass attaching surface 15d. An opening portion is formed in the central portion of the plate 18 to avoid blocking light passing through the second transparent plate 16. The opening portion of the plate 18 has the same shape in the X-Y plane as the opening portion of the seal 17.

The light source board 19 is formed such that lengths thereof are smaller than the X and Y direction lengths of the light source board attaching surface 15c. The light source board 19 is a board extending in the X direction. The light source board 19 is formed from a glass-epoxy board or a metal board such as an aluminum or copper board. The light source board 19 has a connector 19a to supply power from a power supply for driving the light source 20. As may be required, the light source board 19 can be configured by separate boards arranged side-by-side in the X direction.

The light source 20 is a point light source such as an LED. As may be required, the light source 20 can be constituted by a combination of light sources of a plurality of colors that generate colors such as red, blue, green, UV light and IR light. Moreover, the plurality of light sources 20 is arranged not only along the X direction, but along the X direction and the Y direction.

The harness 21 is a cable for driving the light source 20. The harness 21 is formed with sufficient length for connecting together the light source board 19 and the signal processing board 10.

The seal 22, both surfaces thereof forming adhesive surfaces, is formed from a sheet-like material. The adhesive surface of the seal 22 has the same shape as the adhesive surface of the light source board 19. The seal 22 is formed preferably from a material that has good thermal conductivity.

Next, the method of manufacturing the image sensor 200 of Embodiment 2 is explained.

The first transparent plate 2 is fixed to the opening 1f by the seal 3.

The lens support plate 5 and the lens 4 are adhered using a means such as adhesive or double-sided tape. Neither the lens support plate 5 nor the lens 4 is necessary to be a single component, and a structure can be used in that multiple such components are combined. The lens support plate 5 supporting the lens 4 is inserted in and retained by the first casing 1. In such configuration, the focal point of the lens 4 can be made to coincide with the location of the conveyed surface of the object to be read.

The sensor board 7 and the sensor drive board 8 are attached to the board retaining plate 9. By such attachment, the sensor board 7 and the sensor drive board 8 are retained at the +Z side of the board retaining plate 9. The sensor board 7 is adhered to the board retaining plate 9 by a means such as adhesive or tape. During attachment of the sensor board 7 to the board retaining plate 9, the sensor board 7 and board retaining plate 9 are secured with high positional accuracy relatively in the Y and Z directions, because the +Y side surface of the sensor board 7 is in contact with the sensor board attachment reference surface 9b. The sensor 6 is mounted on the sensor board 7. The sensor drive board 8 is arranged parallel to the sensor board 7 due to being in contact with the main surface 9g of the board retaining plate 9. Furthermore, after arranging the fitting holes 9f and the fitting holes 8b to be overlapped in the Z direction, the sensor drive board 8 is adhered using a means such as adhesive or tape.

The sensor drive board 8 is retained by the first casing 1 with the spacer screw 31 inserted into the fitting hole 8b and fitting hole 9f. Thus even when the connector 8a is attached to and detached from the light source-driving connector 10b, the assembled state of the sensor drive board 8 and the first casing 1 is not changed. Thus the assembled state of the sensor drive board 8 and the first casing 1 is stable. The board retaining plate 9 is fixed to the first casing 1 with the spacer screws 31 inserted into the fitting hole 9e and fitting holes 9f.

The fitting hole 9e is formed at the +Y side of the sensor 6. The fitting holes 9f are formed at the −Y side of the sensor 6. In the Y direction, the sensor 6 is disposed at an intermediate position between the fitting hole 9e and the fitting hole 9f. The board retaining plate 9 is affected by tension from the spacer screw 31 inserted in the fitting hole 9e. The board retaining plate 9 is affected by tension from the spacer screws 31 inserted in the fitting holes 9f. The board retaining plate 9 is thus retained facing the +Z side. Thus the sensor 6 is retained by the board retaining plate 9 facing the +Z side. Even though the sensor board 7 and the board retaining plate 9 are fixed to the first casing 1 with the spacer screws 31, the sensor 6 is hardly affected by tension during fastening of the spacer screws 31. Thus characteristics of the sensor 6 are not changed by tension during fastening. Thus the sensor 6 is retained stably. Furthermore, the means for fixing the sensor board 7 and board retaining plate 9 to the first casing 1 is not limited to the spacer screws 31, and means can be used such as fitting with a rivet or gluing.

By fitting the connector 10a in the connector 8a, the signal processing board 10 is connected electrically to the sensor drive board 8. The fitting hole 10d and the fitting hole 9e are overlapped in the Z direction. By inserting the screw 14 into the fitting hole 10d and the screw hole of the spacer screw 31 inserted in the fitting hole 9e, the board retaining plate 9 and the signal processing board 10 are fastened together. Furthermore, the fitting holes 10e and the fitting holes 9f are overlapped in the Z direction. By inserting the screws 14 into the fitting holes 10e and the screw holes of the spacer screws 31 inserted in the fitting holes 9f, the board retaining plate 9 and the signal processing board 10 are fastened together strongly. Thus the signal processing board 10 is fixed to the first casing 1 indirectly. Needless to say, when the signal processing board 10 and the sensor drive board 8 are integrated as a single board, the signal processing board 10 is fixed by fixing the sensor drive board 8 to the first casing 1.

The brackets 41 are fixed to the first casing 1 by inserting the screws 14 in the casing fitting holes 41a and the bracket attaching holes 1a of the first casing 1.

The light source 20 and the connector 19a are mounted on and assembled with the light source board 19 by soldering. The light source board 19 thus becomes a linear light source. Furthermore, instead of the light source board 19 and the light source 20, a surface light source can be used such as a lamp or electroluminescent light source.

The seal 22 is used to fix the light source board 19 to the light source board attaching surface 15c.

The second casing 15 is fixed to the first casing 1 by inserting the screws 14 in the first casing attaching holes 15b. In the same manner as the fixing of the second casing 15 of the +Y side, the second casing 15 of the −Y side is also fixed to the first casing 1.

By fixing the second casing 15 to the first casing 1, the −Z side surface of the second casing 15 is in contact with the +Z side surface of the planar portion 1h. The first casing attaching surface 15a is in contact with the light source attachment reference surface 1d. By this means, the second casing 15 and the first casing 1 are fixed with high positional accuracy relatively in the Z direction.

After the second casing 15 is attached to the first casing 1, a recessed portion 15f is formed between the planar portion 1h and the heat dissipation surface 15e. The recessed portion 15f is recessed in the Y direction. More specifically, the recessed portion 15f is defined by the following: the +Z side surface of the planar portion of the first casing 1, the −Z side surface of the fin of the heat dissipation surface 15e, and the X-Z plane-parallel surface of the second casing positioned between the first casing 1 planar portion and the heat dissipation surface 15e. The recessed portion 15f is formed between the planar portion 1h and the vicinity of the light source board attaching surface 15c of the second casing 15.

A terminal of one end of the harness 21 is inserted in the connector 19a. The terminal of the other end of the harness 21 is inserted in the light source-driving connector 10b. The harness 21 leads from the planar portion 1h to the exterior of the first casing 1, passes through the recessed portion 15f, and connects to the light source board 19 fixed to the second casing 15. More specifically, the harness 21 extends, in order, from the light source-driving connector 10b, the recessed portion formed in the +X side of the planar portion 1h, the recessed portion 15f, and the recessed portion formed in the +X side of the second casing 15 toward the connector 19a. Thus even when the thickness and/or number of the harness 21 change, as long as the harness 21 is able to pass through the various recessed portions, the X, Y and Z direction lengths of the image sensor 200 are not changed.

The cover 13 is fixed to the first casing 1 by inserting the screws 14 in the fitting holes 13a and the cover attachment holes 1b.

The second transparent plate 16 is adhered to the plate 18 using the seal 17. From the opening 15g and along the glass attaching surface 15d, the second transparent plate 16 is inserted in the X direction toward the interior of the second casing 15. The Y direction length of the plate 18 is greater than the Y direction length of the second transparent plate 16 and less than the Y direction length of the opening formed in the glass attaching surface 15d. Thus the plate 18 functions as a rail for sliding of the second transparent plate 16 when the second transparent plate 16 is inserted in the opening 15g. The plate 18 covers the gap between the second casing 15 and the second transparent plate 16, and can prevent foreign objects from entering.

The sealing plate 42 is attached to the bracket 41. The glass pressing surface 42b is positioned at the +Z side of the plate 18, but is not positioned at the +Z side of the second transparent plate 16. By this means, the sealing plate 42 cannot press the second transparent plate 16 directly. That is to say, the sealing plate 42 fixes indirectly the second transparent plate 16 in the X and Z directions. Because the gap formed between the second casing 15 and the second transparent plate 16 is covered by positioning of the sealing plate 42 at the +Z side of the plate 18, entry of foreign objects can be prevented. Furthermore, the means for attachment of the sealing plate 42 to the bracket 41 is not limited to the screws 14, and means can be used such as fitting with a rivet or gluing.

Next, the flow of image information in Embodiment 2 is explained.

Figure 15:
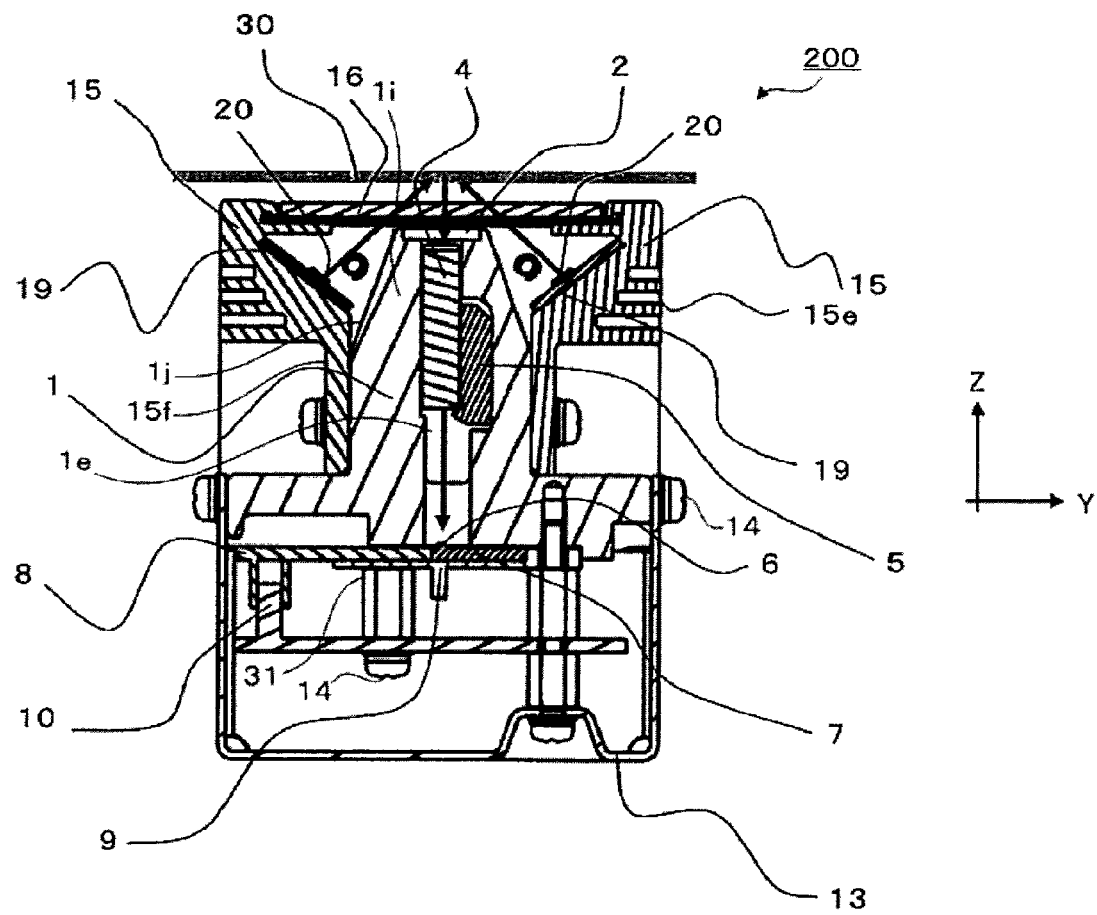
FIG. 15 is a drawing that illustrates an example optical path of the image sensor according to Embodiment 2.

FIG. 15 is a drawing that illustrates an example optical path of the image sensor according to Embodiment 2. The light source 20 is driven by the signal processing board 10 through the harness 21. Light from the light source 20 passes through the second transparent plate 16 and irradiates the object to be read 30. The light reflected by the object to be read 30 passes through the second transparent plate 16 and the first transparent plate 2, and is focused onto the sensor 6 through the lens 4. Thus image information of the object to be read 30 is focused as light on the sensor 6. The photoelectrically converted light is sent from the sensor 6, passes through the sensor drive board 8, arrives at the signal processing board 10, passes through the connector 10c, and is output to equipment external to the image sensor 200. By this means, the image information of the object to be read 30 is output as an electrical signal to the equipment external to the image sensor 200.

Next, the flow of heat generated from the light source 20 in Embodiment 2 is explained.

Heat generated from the light source 20 is conducted thermally to the light source board 19 through the surface of the light source board 19 on which the light source 20 is mounted. The heat of the light source board 19 is conducted thermally to the seal 22, which is in contact intimately with the backside surface opposite to the mounting surface of the light source 20. Heat of the seal 22 is conducted thermally to the second casing 15 through the light source board attaching surface 15c. After spreading of heat within the second casing 15 from the light source board attaching surface 15c, heat of the second casing 15 is released to the atmosphere from the surfaces of the second casing 15, including the heat dissipation surface 15e.

The harness 21 passes through the recessed portion 15f as the harness route. The recessed portion 15f is recessed toward the interior of the second casing 15. Thus the harness 21 is wired to the interior of the external shape of the second casing 15. In this configuration, the image sensor 200 has a simple structure, and thus risk can be prevented of product damage due to work mistakes, such as catching of the harness 21, during work such as attachment of components to the image sensor 200.

Next, the dust-proofing effect of the image sensor 200 of Embodiment 2 is explained. The opening 1f is sealed by the first transparent plate 2. The opening of the −Z side of the first casing 1 is sealed by the sensor drive board 8 and the board retaining plate 9. The X direction holes of the first casing 1 are sealed by the brackets 41 and the sealing plates 42. That is to say, because a sealed configuration is used for all the openings formed in the first casing 1, a high dust-proofing effect can be secured for the lens 4 and sensor 6 of the interior of the first casing 1.

On the other hand, the plate 18 and second transparent plate 16 are placed and mounted on the glass attaching surface 15d. X and Y direction lengths of the plate 18 are approximately equal to the X and Y direction lengths of the glass attaching surface 15d. Furthermore, one portion of the +Z side surface of the plate 18 is stacked in the Z direction with the −Z side surface of the second transparent plate 16. Moreover, the first casing attaching surface 15a is in contact with the light source attachment reference surface 1d. The −Z side surface of the second casing 15 is in contact with the +Z side surface of the planar portion 1h. Also, +X and −X sides of the second casing 15 are covered by the brackets 41 and sealing plates 42. Because the openings of the sealing plates 42 are covered by the plates 18 of the +X and −X sides, a high dust-proofing effect can be secured for the light source 20 and the lens 4 and the sensor 6 of the interior of the first casing 1. That is to say, all of the openings formed in the second casing 15 are sealed, and thus a high dust-proofing effect can be secured for the light source 20 and the lens 4 and the sensor 6 of the interior of the first casing 1. The light source board 19 is fixed to the light source board attaching surface 15c by the seal 22. Thus the light source 20 is retained in the second casing 15. The second casing 15 is fastened to the first casing 1 by inserting screws 14 in the light source attachment holes 1c. The second casing 15 can be attached to and detached from the first casing 1 easily by attachment and removal of the screws 14. While the first casing 1 remains sealed, the light source board 19 and the light source 20 can be replaced in this manner by attachment and removal of the screws 14.

Moreover, as illustrated in FIG. 11, the brackets 41 do not cover the +Z side of the glass attaching surface 15d. More specifically, the brackets 41 do not cover the +Z and −Z sides of the opening portions opening in the X direction of the second casing 15. Thus while the brackets 41 remain attached, the second transparent plate 16 and the plate 18 can be pulled off in the X direction. The dust-proofing ability and desired optical characteristics of the image sensor 200 may not be obtained when the second transparent plate 16 breaks or has surface deterioration due to an abrasion. Even when such breakage or deterioration occurs, the second transparent plate 16 and plate 18 can be replaced easily while maintaining the dust-proofing effect of the lens 4 within the first casing 1.

Moreover, an image sensor is known previously in which a cable connected electrically to a printed circuit board of an organic electroluminescent unit is wired from a cable passageway and through a through hole to the exterior of a housing, as exemplified by Patent Literature 2. However, due to wiring of the cable at the exterior of the housing, this type of image sensor has a problem in that the exterior shape of the image sensor changes according to properties of the cable, such as thickness and/or number.

The harness 21 connects to the light source board 19 through the non-projecting portion (recessed portion 15f) of the second casing 15 formed between the planar portion 1h and the fixing portion of the light source board 19 of the second casing 15, and thus external shape of the image sensor 200 is not changed even when the harness 21 passes through the exterior portion of the casing.

The present disclosure can be embodied in various ways and can undergo various modifications without departing from the broad spirit and scope of the disclosure. Moreover, the embodiment described above is for explaining the present disclosure, and does not limit the scope of the present disclosure. In other words, the scope of the present disclosure is as set forth in the Claims and not the embodiment. Various changes and modifications that are within the scope disclosed in the claims or that are within a scope that is equivalent to the claims of the disclosure are also included within the scope of the present disclosure.

This application claims the benefit of Japanese Patent Application No. 2013-056761 and No. 2013-056764, filed on Mar. 19, 2013, the entire disclosure of which is incorporated by reference herein.

REFERENCE SIGNS LIST

1 First casing
1a Bracket attaching hole
1b Cover attachment hole
1c Light source attachment hole
1d Light source attachment reference surface
1e Lens containing portion
1f Opening
1g Stepped portion
1h Planar portion
1i Projecting portion
1j Surface
2 First transparent plate
3 Seal
4 Lens (focusing optical system)
5 Lens support plate
6 Sensor (light receiver)
7 Sensor board
8 Sensor drive board
8a Connector
8b Fitting hole
9 Board retaining plate
9a Casing attachment surface
9b Sensor board attachment reference surface
9d Reinforcing structure
9e Fitting hole
9f Fitting hole
9g Main surface
10 Signal processing board
10a Connector
10b Light source-driving connector
10c Connector
10d Fitting hole
10e Fitting hole
11 Bracket
11a Casing fitting hole
11b Sealing plate fitting hole
12 Sealing plate
12a Fitting hole
12b Glass pressing surface
13 Cover
13a Fitting hole
14 Screw
15 Second casing
15a First casing attaching surface
15b First casing attaching holes
15c Light source board attaching surface
15d Glass attaching surface
15e Heat dissipation surface
15f Recessed portion
15g Opening
16 Second transparent plate
17 Seal
18 Plate
19 Light source board
19a Connector
20 Light source 21 Harness
22 Seal
30 Object to be read
31 Spacer screw
41 Bracket
41a Casing fitting hole
41b Sealing plate fitting hole
42 Sealing plate
42a Fitting hole
42b Glass pressing surface
100 Image sensor
200 Image sensor

The invention claimed is:

1. An image sensor, comprising:
a focusing optical system configured to focus light after passing through or reflected by an irradiated object and passing through a first cover-plate portion;
a light receiver arranged along a main scanning direction and configured to receive the light focused by the focusing optical system;
a board member configured to support the light receiver;
a first casing including a first opening in a side of the irradiated object, a second opening in aside opposite to the side of the irradiated object, and a hole extending in the main scanning direction, the first casing being configured to contain or retain the focusing optical system and the light receiver;
a bracket configured to be fixed to the main scanning direction end portion of the first casing; and
a sealing plate configured to be fixed to the bracket, wherein
the first cover-plate portion is configured to seal the first opening;
the board member is configured to seal the second opening;
the bracket and the sealing plate are configured to seal the hole extending in the main scanning direction; and
the focusing optical system contained or retained in the first casing is sealed.

2. The image sensor according to claim 1, wherein the board member comprises:
a sensor board on which the light receiver is formed;
a sensor drive board configured to drive the light receiver; and
a board retaining plate configured to be attached with the sensor board and the sensor drive board.

3. The image sensor according to claim 2, further comprising:
an irradiator extending in the main scanning direction and configured to irradiate the light through a second cover-plate portion toward the irradiated object;
a second casing fixed to the first casing, retaining the second cover-plate portion opposing the first cover-plate portion, and containing or retaining the irradiator; and
a second cover-plate portion fixing plate arranged at end portion in the main scanning direction of the first casing and configured to attach the second cover-plate portion to the second casing detachably.

4. The image sensor according to claim 3, wherein the bracket covers an opening of an end portion in the main scanning direction of the second casing.

5. The image sensor according to claim 3, wherein
the second cover-plate portion fixing plate is the sealing plate; and
the sealing plate comprises:
a sealing surface for covering the hole of the first casing; and
a pressing surface for fixing the second cover-plate portion; and
the sealing plate is L-shaped, by the sealing surface and the pressing surface that are arranged perpendicular.

6. The image sensor according to claim 5,
wherein the second cover-plate portion comprises:
a transparent plate; and
a plate that is longer than the transparent plate, for fixing to the transparent plate; and
the plate has an opening in a central portion, that is passed through by light passed through a transparent plate.

7. The image sensor according to claim 6, wherein the second cover-plate portion is retained by the second casing by insertion of the second cover-plate portion in the main scanning direction along an attachment surface of the second casing for attachment of the second cover-plate portion, the plate functioning as a rail for the insertion by sliding thereon.

8. The image sensor according to claim 1, further comprising:
an irradiator extending in the main scanning direction and configured to irradiate the light through a second cover-plate portion toward the irradiated object;
a second casing fixed to the first casing, retaining the second cover-plate portion opposing the first cover-plate portion, and containing or retaining the irradiator; and
a second cover-plate portion fixing plate arranged at end portion in the main scanning direction of the first casing and configured to attach the second cover-plate portion to the second casing detachably.

9. The image sensor according to claim 8, wherein the bracket covers an opening of an end portion in the main scanning direction of the second casing.

10. The image sensor according to claim 8, wherein
the second cover-plate portion fixing plate is the sealing plate; and
the sealing plate comprises:
sealing surface for covering hole of the first casing; and
a pressing surface for fixing the second cover-plate portion; and
the sealing plate is L-shaped, by the sealing surface and the pressing surface that are arranged perpendicular.

11. The image sensor according to claim 10,
wherein the second cover-plate portion comprises:
a transparent plate; and
a plate that is longer than the transparent plate, for fixing to the transparent plate; and
the plate has an opening in a central portion, that is passed through by light passed through a transparent plate.

12. The image sensor according to 11, wherein the second cover-plate portion is retained by the second casing by insertion of the second cover-plate portion in the main scanning direction along an attachment surface of the second casing for attachment of the second cover-plate portion, the fixing plate functioning as a rail for the insertion by sliding thereon.

* * * * *